United States Patent
Axelowitz et al.

(10) Patent No.: US 9,991,616 B2
(45) Date of Patent: Jun. 5, 2018

(54) SMT CONNECTION OF RIGID AND FLEXIBLE PRINTED CIRCUIT BOARDS

(71) Applicant: Apple Inc., Cupertino, CA (US)

(72) Inventors: Corey N. Axelowitz, San Francisco, CA (US); William A. Tashman, San Francisco, CA (US); James Y. Yap, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/158,389

(22) Filed: May 18, 2016

(65) Prior Publication Data
US 2017/0271799 A1    Sep. 21, 2017

Related U.S. Application Data

(60) Provisional application No. 62/310,621, filed on Mar. 18, 2016.

(51) Int. Cl.
| H01R 12/00 | (2006.01) |
| H01R 12/79 | (2011.01) |
| H01R 12/72 | (2011.01) |
| H01R 43/02 | (2006.01) |

(52) U.S. Cl.
CPC ........... *H01R 12/79* (2013.01); *H01R 12/721* (2013.01); *H01R 43/0256* (2013.01)

(58) Field of Classification Search
CPC ........ H05K 3/365; H05K 3/361; H01R 12/62; H01R 12/79; H01R 23/668
USPC ............................................ 439/67, 493, 495
See application file for complete search history.

(56) References Cited

U.S. PATENT DOCUMENTS

| 8,096,837 | B2* | 1/2012 | Kan ..................... H01R 13/501 |
| | | | 439/638 |
| 8,482,928 | B2* | 7/2013 | Capeleto ................ H05K 1/148 |
| | | | 174/260 |
| 8,971,047 | B2* | 3/2015 | Lee ........................ H05K 1/147 |
| | | | 361/749 |
| 9,204,537 | B2* | 12/2015 | Daghighian ......... H05K 1/0283 |
| 9,614,332 | B2* | 4/2017 | Curtin .................. H01R 13/665 |
| 2009/0025962 | A1* | 1/2009 | Gelardi .................. H05K 1/147 |
| | | | 174/254 |

* cited by examiner

*Primary Examiner* — Hien Vu
(74) *Attorney, Agent, or Firm* — Kilpatrick Townsend & Stockton LLP

(57) ABSTRACT

The described embodiments relate generally to methods and apparatus for securely and efficiently joining components together. In some embodiments, a flexible printed circuit board and a rigid printed circuit board can be electrically coupled together by soldering electrical contacts distributed on the flexible printed circuit board to electrical contacts distributed on the rigid printed circuit board. The electrical contacts can be arranged and sized as desired to provide a desired amount of data and power transfer bandwidth.

12 Claims, 9 Drawing Sheets

SMT CONNECTION OF RIGID AND FLEXIBLE PRINTED CIRCUIT BOARDS

CROSS-REFERENCE TO RELATED APPLICATIONS

This application claims priority to U.S. Provisional Patent Application No. 62/310,621, filed Mar. 18, 2016, and entitled "SMT CONNECTION OF RIGID AND FLEXIBLE PRINTED CIRCUIT BOARDS", which is herein incorporated by reference in its entirety.

FIELD

The described embodiments relate generally to electrical connectors. More particularly, the present embodiments are directed towards robust connections between flexible and rigid printed circuit boards.

BACKGROUND

Manufacturers of portable electronic devices consistently struggle to reduce wasted space within the devices so that the devices can be made increasingly smaller and/or include greater amounts of functionality. Board to board connectors provide a practical way of connecting a flexible printed circuit board to a rigid printed circuit board. Unfortunately, because there is no solid connection (i.e. soldered connection) between the connector and receptacle of a board to board connector, the design of a board to board connector can be undesirably large in order to provide an efficient enough coupling to pass a sufficient amount of power and data through the board-to-board connector.

SUMMARY

This disclosure describes various embodiments that relate to methods and apparatus for electrically coupling a flexible PCB to a rigid PCB.

An electronic assembly is disclosed and includes a flexible printed circuit board having a first array of electrical pads arranged at a first end of the flexible printed circuit board. The electronic assembly also includes a rigid printed circuit board (PCB) having a second array of electrical pads arranged along an exterior surface of the rigid PCB. The first array of electrical pads are soldered directly to corresponding ones of the second array of electrical pads.

An electronic device is disclosed and includes a first printed circuit board including a connector. The electronic device also includes a second printed circuit board having a first array of electrical contacts arranged in a first pattern. A flexible connector has a first end and a second end opposite the first end. The first end has a second array of electrical contacts arranged in a second pattern complementary to the first pattern, which is soldered directly to the first array of electrical contacts. A device housing at least partially encloses the first and second printed circuit boards and the flexible connector.

A method for electrically coupling a flexible printed circuit board to a rigid printed circuit board (PCB) is disclosed. The method includes attaching a first array of electrical contacts to the flexible printed circuit board. The attaching can be performed by carrying out a material deposition operation. A second array of electrical contacts can be attached to the rigid PCB. The first array of electrical contacts can be soldered directly to the second array of electrical contacts during an SMT process.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
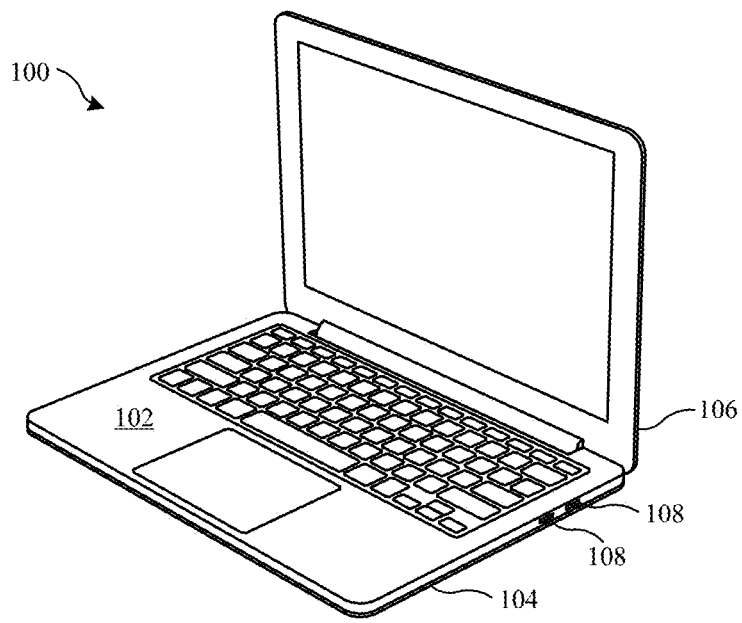
FIGS. 1A-1B depict upper and lower perspective views of a portable computing device suitable for use with the described embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

A flexible printed circuit board ("flex") is an electronic circuit printed on a flexible polymer substrate that can be utilized to construct a flexible connector in applications where flexibility, space savings, or other production constraints prevent traditional connectors, such as wires from being utilized. In some embodiments, a flex can be utilized to construct a flexible printed circuit board assembly that connects a first component to a second component. For example, the flexible printed circuit board assembly can interconnect a first electrical component to a second electrical component. The components can then communicate with each other over signals transmitted by the flex. The signals can be transmitted by a number of electrically conductive pathways that can take the form of leads and traces embedded within the flex. The electrically conductive pathways can handle discrete routing of a number of signals between the first and second electrical components. It should be noted that the electrically conductive pathways can be distributed across a number of different layers that make up the flex.

One disadvantage of using a flexible printed circuit board construction is that connections between the flexible printed circuit board and a rigid printed circuit board (PCB) generally take the form of board-to-board or zero insertion force connectors. While these connectors have the advantage of allowing convenient separation of the flexible PCB from the rigid PCB, the footprint taken up on the board tends to be substantial when high speed data and/or high voltage power is being transmitted through the connector. The size of these connectors is relatively large as a consequence of the electrical coupling generated by the connectors not being a solid connection but instead taking the form of multiple contacts being pressed together. This construction increases the amount of resistance inherent to the connector. The increased resistance resulting from the lack of a solid connection reduces the amount of power that can be transferred and also degrades the signal integrity of data passing through the connector. Consequently, a substantially greater amount of surface area is needed in these types of connectors to achieve robust power and data transmission pathways than would otherwise be needed for a solid connection along the lines of a soldered connection.

One solution to this problem is to solder contacts distributed along a surface of the flexible PCB directly to pads on the rigid PCB. In some embodiments, the soldering can be carried out by a Surface-Mount Technology (SMT) process in which solder is applied between the contacts and then the flexible PCB and the rigid PCB are heated to solidify the connections between the contacts. This construction type has the following major advantages over conventional flexible to rigid PCB connectors: (1) each of the connections between the flexible PCB and the rigid PCB is a continuous connection formed by solder solidified between the contacts and the pads during an SMT process; (2) each pad and contact can be precisely sized and shaped to accommodate the amount of power and/or data desired to pass between the flexible PCB and the rigid PCB; and (3) the contacts and pads can be distributed in a pattern configured to conform with space available on the rigid PCB. For example, the pads can be arranged around another component or obstruction that cannot be moved on account of various design requirements. In some embodiments, the flexible PCB can have customized geometries suitable for supporting a non-conventional connector footprint. For example, a number of protrusions can extend from one end of the flexible PCB so that the flexible PCB can be prevented from interfering with areas with obstructions.

These and other embodiments are discussed below with reference to FIGS. 1A-7; however, those skilled in the art will readily appreciate that the detailed description given herein with respect to these figures is for explanatory purposes only and should not be construed as limiting.

Figure 1B:
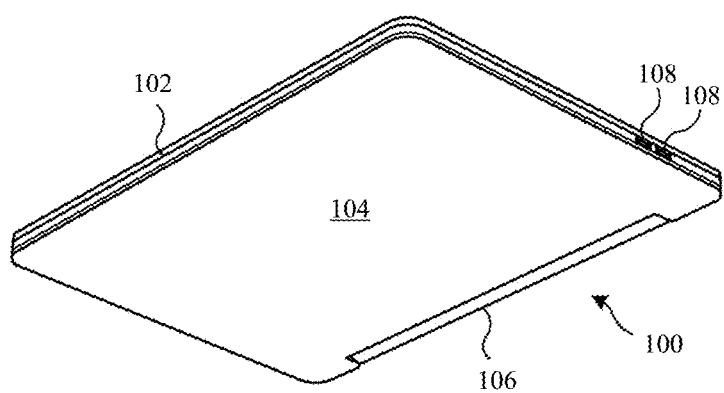

FIGS. 1A-1B depict upper and lower perspective views of a portable computing device 100 suitable for use with the described embodiments. FIG. 1A shows how portable computing device 100 can include top case 102 and bottom case 104, which cooperate to form an internal volume. In some embodiments, top case 102 and bottom case 104 can be attached to each other by threaded fasteners, adhesive, snap attachments or some combination of the aforementioned attachment features. Circuitry for supporting the functionality of I/O ports 108 can be disposed within the internal volume defined by top case 102 and bottom case 104. In some embodiments, portable computing device 100 can be a laptop that includes hinged display assembly 106. Top case 102 can include user accessible ports 108 for transferring data and/or power into and out of portable computing device 400. In some embodiments, user accessible ports 108 can include any number of the following types of ports: power, USB 2.0, USB 3.0, audio, DisplayPort, High Definition Media Input, and camera media cards. In some embodiments, user accessible ports 108 can take the form of reversible USB-C ports having tongues formed of PCB material and extending into a receptacle cavity configured to receive a connector plug. In FIG. 1B a better view of bottom case 104 is provided as well as a view of a lower portion of hinged assembly 106.

Figure 2A:
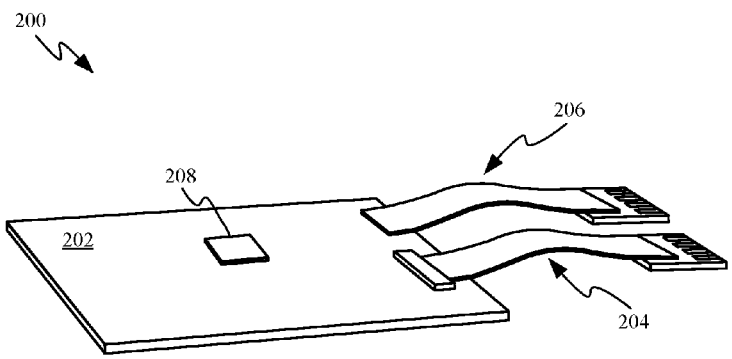
FIG. 2A shows a perspective view of a rigid printed circuit board and two connector assemblies.

FIG. 2A shows a perspective view of an electronic assembly 200, which includes a rigid printed circuit board (PCB) 202. Rigid PCB 202 can be configured to utilize multiple connector assemblies for communicating with other internal components or alternatively for connection to input/output ports. Connector assemblies 204 and 206 are depicted being coupled to one side of rigid PCB 202. In some embodiments, processor 208 can be coupled with electrically conductive traces of rigid PCB 202. These electrically conductive traces can put processor 208 into electrical communication with one or more of connector assemblies 204 and 206. In this way, processor 208 can send instructions to components not directly attached to rigid PCB 202.

Figure 2B:
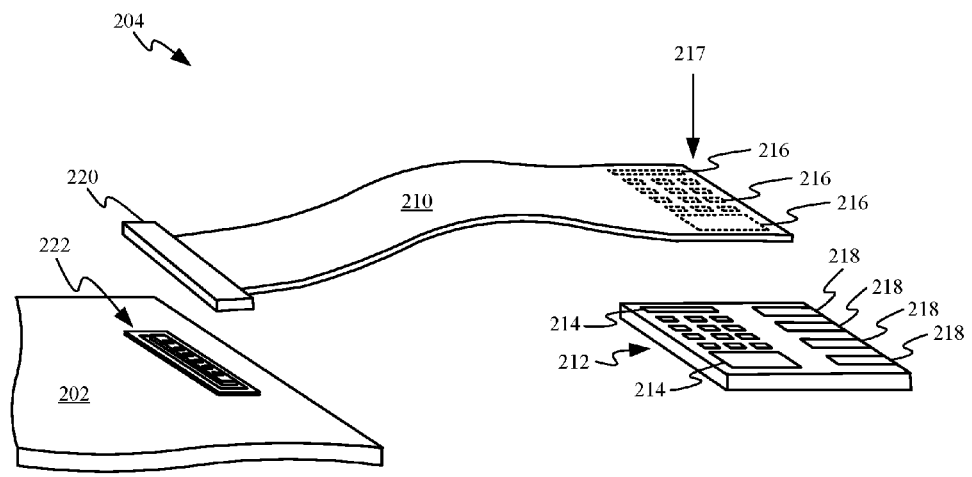
FIG. 2B shows a close-up view of one of the connector assemblies depicted in FIG. 2A.

FIG. 2B shows a close-up view of connector assembly 204. In particular, connector assembly 204, which includes at least flexible PCB 210 and rigid PCB 212, is shown in a disconnected state so that pads 214 and contact 216 can be depicted. In some embodiments, both pads 214 and contacts 216 can be formed by depositing thin layers of copper onto both flexible PCB 210 and rigid PCB 212. In some embodiments, the thin layers of copper can have a thickness of about 30 microns. Arrow 217 shows a direction in which flexible PCB 210 can be moved to place pads 214 into contact with contacts 216. By applying solder to pads 214 and positioning contacts 216 against that solder, flexible PCB 210 and rigid PCB 212 can be electrically coupled without a large board-to-board connector or ZIF connector. It should be noted that the other end of connector assembly 204 can include a non-SMT connector 220. Non-SMT connector 220 can be configured to allow for a releasable coupling between connector assembly 204 and rigid PCB 202. While non-SMT connector 220 is depicted as a board-to-board connector configured to mate with connector 222, a zero-insertion force connector or other releasable connector is also possible. This configuration can be helpful when it is desirable to replace connector assembly 204 without replacing rigid PCB 202. In this way, replacing a faulty connector assembly 204 would only involve the replacement of flexible PCB 210 and rigid PCB 212. In some embodiments, rigid PCB 212 can also include edge connector contacts 218 configured to provide a conduit for offloading signals passed across flexible PCB 210.

Figure 2C:
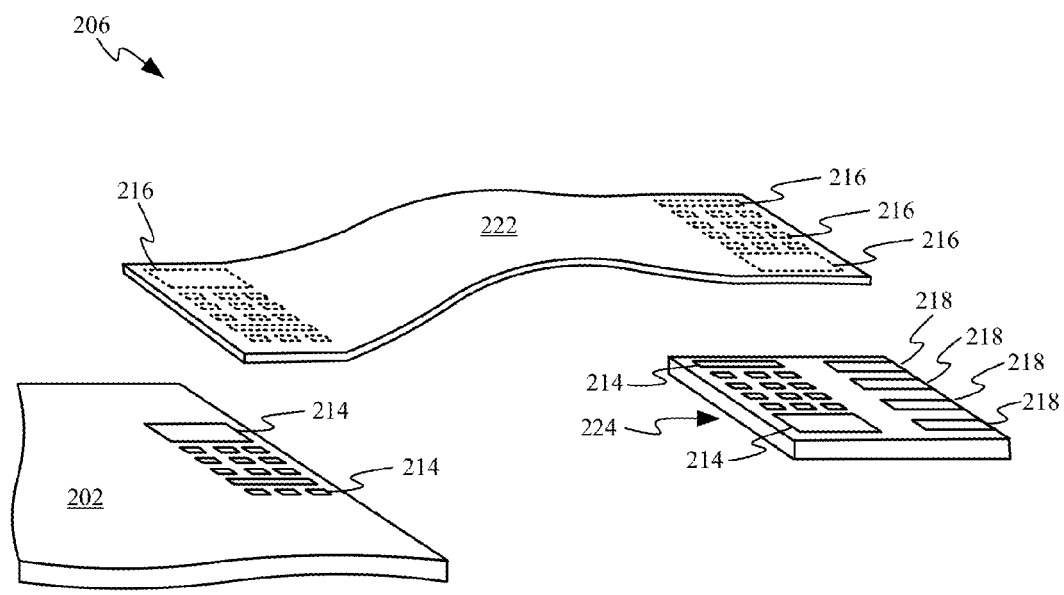
FIG. 2C shows a close-up view of another one of the connector assemblies depicted in FIG. 2A.

FIG. 2C shows a close-up view of connector assembly 206. Connector assembly 206 includes flexible PCB 222, which is configured to be SMT'd to both rigid PCB 202 and rigid PCB 224. Such a configuration can be beneficial where space is at a premium on PCB 202 and PCB 202 is a component in a part which is either unsuitable for rework or connector assembly 206 and PCB 202 tend to fail at the same time. It should be noted that while all of the depicted exemplary embodiments show flexible PCB to rigid PCB connections, flexible PCB to flexible PCB connections are also possible and could be desirable in certain circumstances.

Figure 3A:
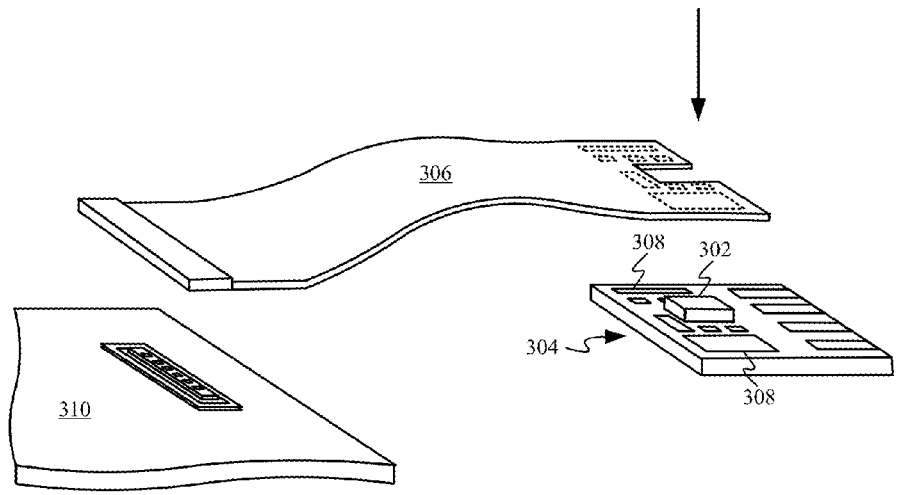
FIGS. 3A-3B show perspective views of an alternative connector assembly in which one end of the connector assembly is arranged to extend around an obstruction.
Figure 3B:
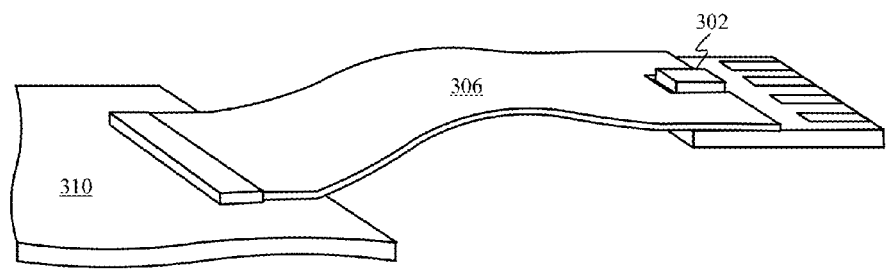

FIGS. 3A-3B show perspective views of an alternative connector configuration in which one end of the connector is arranged to connect to a portion of a PCB having an obstruction. While a more conventional connector assembly would have a rectangular layout, the custom designs allowable by custom placement of electrical connectors wherever they fit, allows a relatively large footprint connector to be distributed across two or more areas. FIG. 3A shows an obstructing component 302 positioned on PCB 304 in a location that could otherwise preclude the attachment of a flexible PCB 306. In this embodiment, the end of flexible PCB 306 can be adjusted so that electrical contacts 308 are distributed to either side of obstructing component 302. Flexible PCB 306 can be altered to define a notch sized to accommodate protruding component 302. It should be noted that while the opposite side of flexible PCB 306 is depicted including a board to board connector for attachment to PCB 310.

Figure 3C:
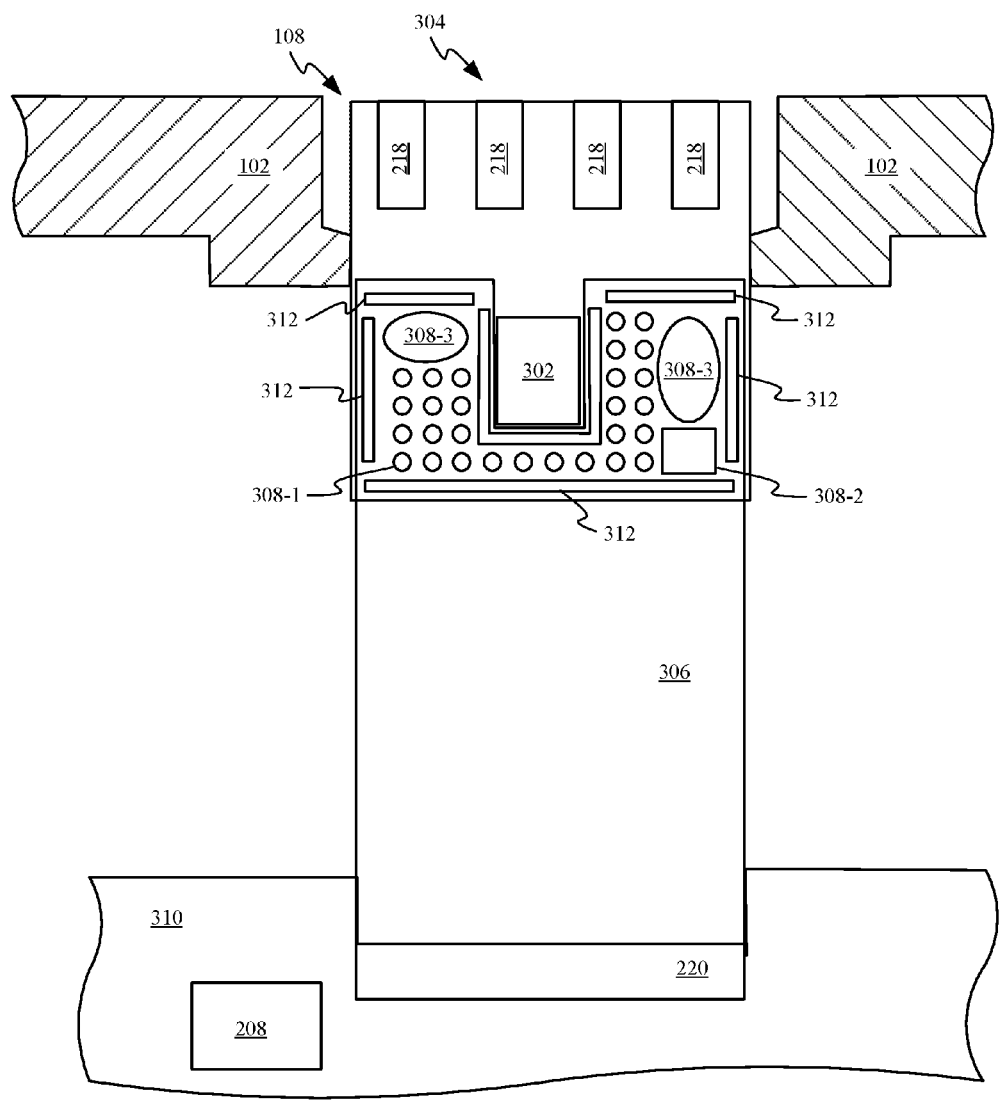
FIG. 3C shows a top view of a PCB having an alternative arrangement of electrical contacts.

FIG. 3C shows a top view of PCB 304 having an alternative arrangement of electrical contacts 308. In particular, FIG. 3C shows how an array of electrical contacts 308 can include electrical contacts 308 having many different sizes and shapes and how they can be arranged along the surface of PCB 304 in varying patterns. For example, circular electrical contacts 308-1 could be configured to carry data only, while larger rectangular contacts 308-2 can be configured to carry power. In some embodiments, electrical contacts 308-2 can be configured to carry 5V of power. Electrical contacts 308-3 can have oval geometries and be configured to carry larger power voltages. For example, electrical contacts 308-3 could be configured to carry 12V of power. PCB 304 can also include grounding strips 312, which border electrical contacts 308. When grounding strips 312 are coupled with grounding strips arranged along flexible PCB 306, grounding strips 312 can be configured to act as an EMI shielding barrier that prevents signals being passed through electrical contacts 308 from being interfered with. FIG. 3C also shows PCB 304 being used as indicated above as a tongue for I/O port 108 and how contacts 218 are positioned within the receptacle defined by top case 102. PCB 304 is shown being electrically coupled to PCB 310 by flexible PCB 306. It should be noted that while flexible PCB 306 would normally obscure view of electrical contacts 308 it has been left transparent to maintain visibility of electrical contacts 308 and to show the position of electrical contacts 308 relative to obstructing component 302. Processor 208, previously depicted in FIG. 2A is also depicted on PCB 310.

Figure 4:
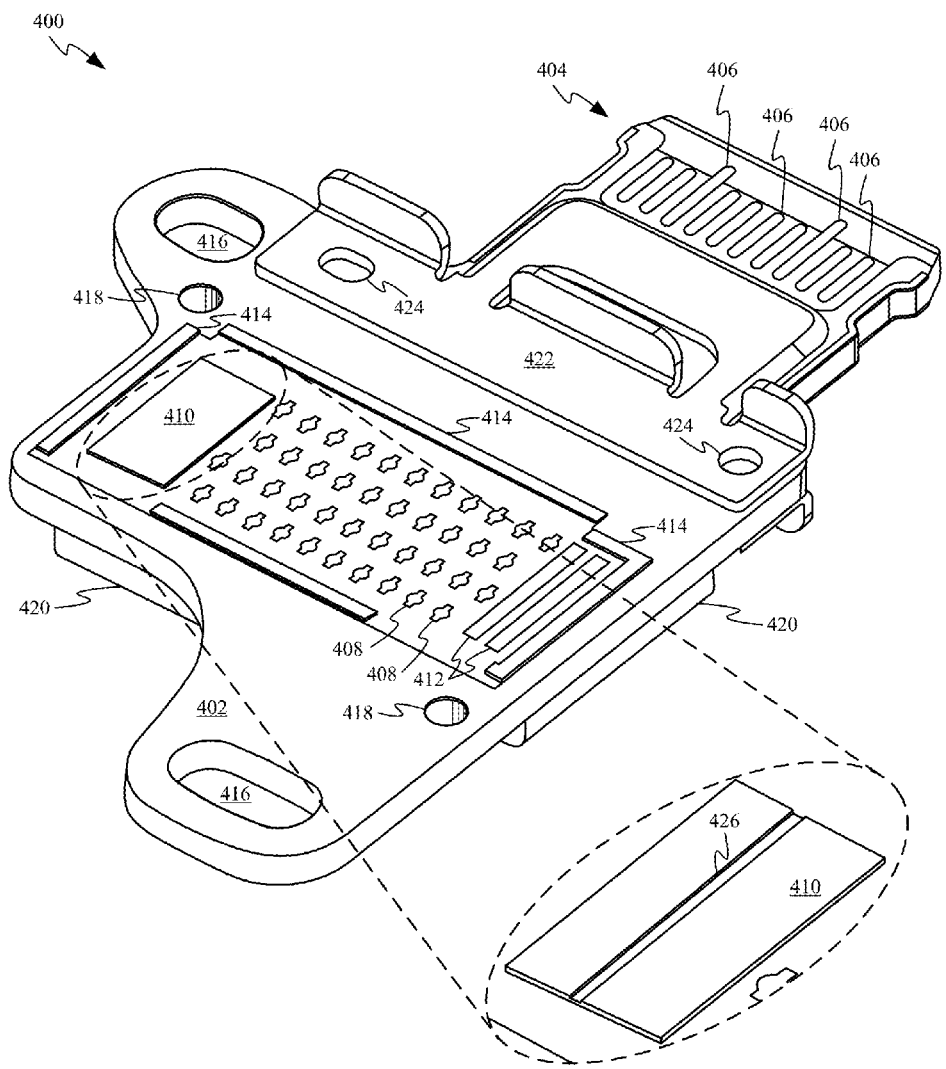
FIG. 4 shows a perspective view of a PCB module suitable for use with the described embodiments.

FIG. 4 shows a perspective view of a PCB module 400 suitable for use with the described embodiments. In particular, PCB module 400 includes rigid PCB 402, which acts as a substrate for connecting the other portions of PCB module 400. Rigid PCB 402 includes tongue portion 404, which protrudes from one end of rigid PCB 402. In some embodiments, rigid PCB 402 can be formed from a low dielectric constant (low DK) material, which can increase both the electrical and mechanical performance of rigid PCB 402. Tongue portion 404 can include a number of electrical contacts 406 configured to form a high-speed input/output (I/O) port along the lines of a USB-C port. Such a port could take the form of I/O Port 108 as depicted in FIGS. 1A-1B. Rigid PCB 402 also provides a flat surface along which numerous electrical contacts or pads can be arranged in a desired pattern. In the depicted embodiment, numerous smaller data pads 408 are depicted arranged in a series of rows. Each data pad 408 can correspond to a discrete pathway for carrying data associated with a particular process or component within a device associated with PCB module 400. Data pads 408 can be configured to receive data from corresponding data pads on a flexible PCB with minimal effect on signal integrity on account of the solid soldered connection that joins the data pads. For this reason, the array of data pads 408 can take up a substantially smaller footprint than would otherwise be needed for board to board or ZIF type connectors that take up more space in order to account for signal integrity degradations caused by discontinuities in the connector interface.

The pattern of electrical contacts can also include power contact 410. Power contact 410 can be sized to accommodate the total amount of power deliverable through the I/O port associated with tongue portion 404. While a rectangular power contact is shown it should be appreciated that any size or shape could be used and that increasing the total area of power contact 410 correspondingly increases the maximum amount of power that can be safely routed through it. It should be appreciated that in some electrical contact arrays numerous power contacts 410 could be desirable. For example, numerous power contacts could be used to carry electrical power of varying voltages. The electrical contact array can also include contacts 412, which can be configured to carry both power and data. This could be desirable for carrying data and supplying power for certain types of legacy signal types. Finally, the electrical contact array can also include grounding strips 414. Grounding strips 414 can help to both provide robust grounding pathways for a flexible PCB attached to the electrical contact array and also help shield the data passing into the contacts from receiving or giving off electrical radiation. In this way, grounding strips 414 can effectively act as an EMI shield.

Rigid PCB 402 can also include numerous fastener opening 416. Fastener openings 416 can be sized to allow the securing of rigid PCB 402 to another component such as a device housing. In this way, tongue portion can be secured in place in a manner that prevents shifting or unwanted movement during use of an I/O port associated with tongue portion 304. Rigid PCB 402 can also include numerous smaller opening 418. Smaller openings 418 can be configured to help precisely position PCB module 400 on an SMT fixturing device to achieve precise positioning during the SMT process. Small alignment pins from the SMT fixturing device can extend through smaller openings 418 to precisely position PCB module 400 with respect to the SMT fixturing device. PCB module 400 can also include a traditional EMI shield 420. EMI shield 320 can be used to cover conventional components. In some embodiments, the components beneath EMI shield 320 can take the form of signal boosting components for improving signals arriving and leaving PCB module 400. PCB module 400 can also include stiffeners 422, which can be operative to add strength to tongue portion 404. Stiffeners 422 can be arranged on both sides of tongue portion 404. Flanged features of stiffeners 422 can also be configured to align PCB module 400 with an interior facing surface of a device associated with PCB module 400. Stiffeners 422 can also define openings 424, which can each be used to receive a fastener for securing stiffeners 422 to rigid PCB 402. In some embodiments, a fastener can extend through openings 424 of both stiffeners 422.

Finally a close-up view of electrical pad 410 includes a channel 426 extending from one side of electrical pad 410 to the other. Channel 426 can be configured to establish a path along which any gases generated during an SMT process can escape without interfering with the SMT process. The release of these types of gases is commonly referred to as outgassing and the gases can be generated by the evaporation of materials within the solder. If given no avenue of escape, these gases could create bubbles between the flexible PCB and electrical pad 410, which could reduce the quality of the bond created during the SMT process. In some embodiments, channel 426 can have a depth of about 30 microns and be defined by simply leaving a gap between two portions of electrical pad 410. While a single channel 426 is depicted it should be appreciated that channels having different geometries can also be employed to create escape paths for gases generated during an SMT process.

Figure 5:
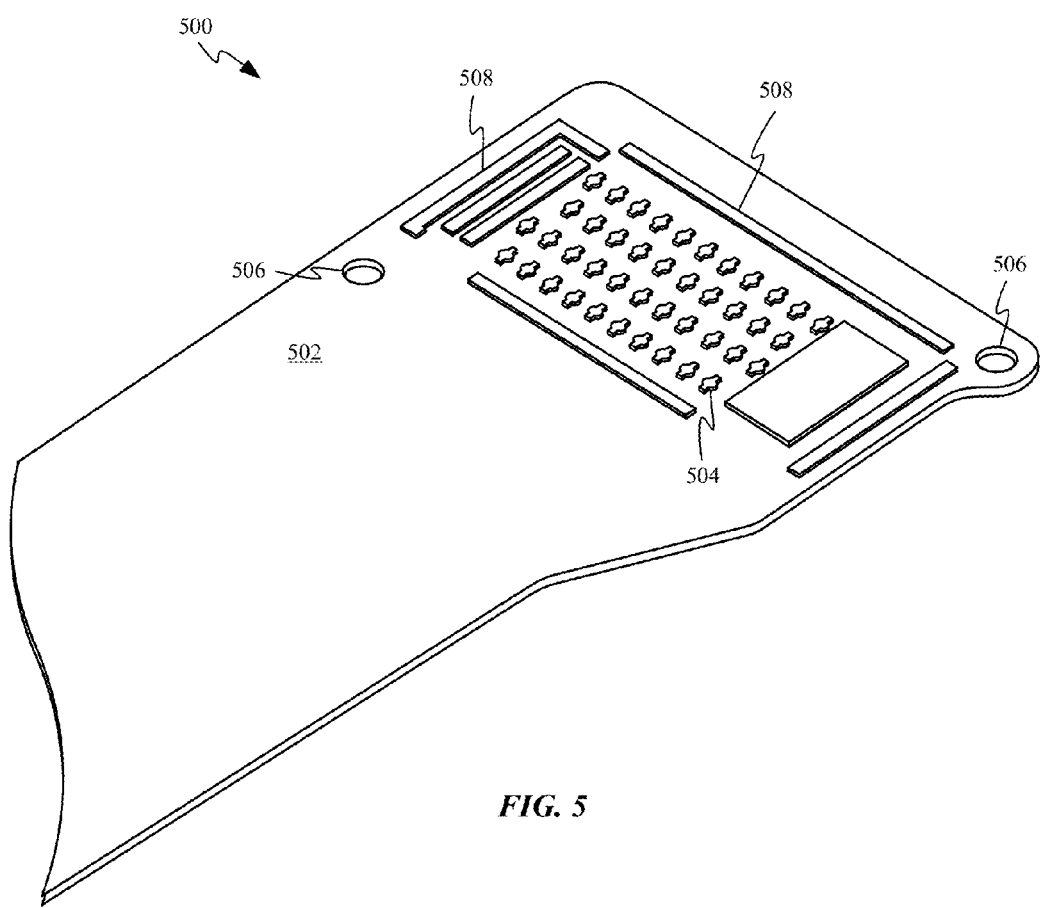
FIG. 5 depicts electronic pads arranged along a surface of a flexible printed circuit board.

FIG. 5 depicts flexible PCB 500. Flexible PCB 500 includes a multi-layer polymeric substrate 502 configured to carry signals and power in various layers of polymeric substrate 502. In some embodiments, polymeric substrate 502 can take the form of a multi-layer polyimide film. Electrically conductive pathways can be arranged on each layer of the multi-layer polyimide film to route a desired number of signals through multi-layer polymeric substrate 502. Flexible PCB 500 can have an array of electrical contacts 504 complementary to the one depicted in FIG. 4. The array of electrical contacts 504 can be attached to flexible PCB 500 using a material deposition process. Flexible PCB 500 also defines multiple openings 506 configured to accept alignment pins, so that during an SMT processing operation the electrical contacts of flexible PCB 500 can stay precisely aligned with the electrical contacts of PCB module 400. In some embodiments, flexible PCB 500 can include exterior surface layers formed of electrically conductive material such as copper, which can help shield the signals carried by flexible PCB 500 from interference. The electrically conductive material (i.e. shielding material) in the outer layer of the flexible PCB can also cooperate with grounding strips 508 to form an EMI shield that shields electrical contacts 504 from interference when flexible PCB 500 is coupled with another device along the lines of PCB module 400, which is shown in more detail in FIG. 6 below.

Figure 6:
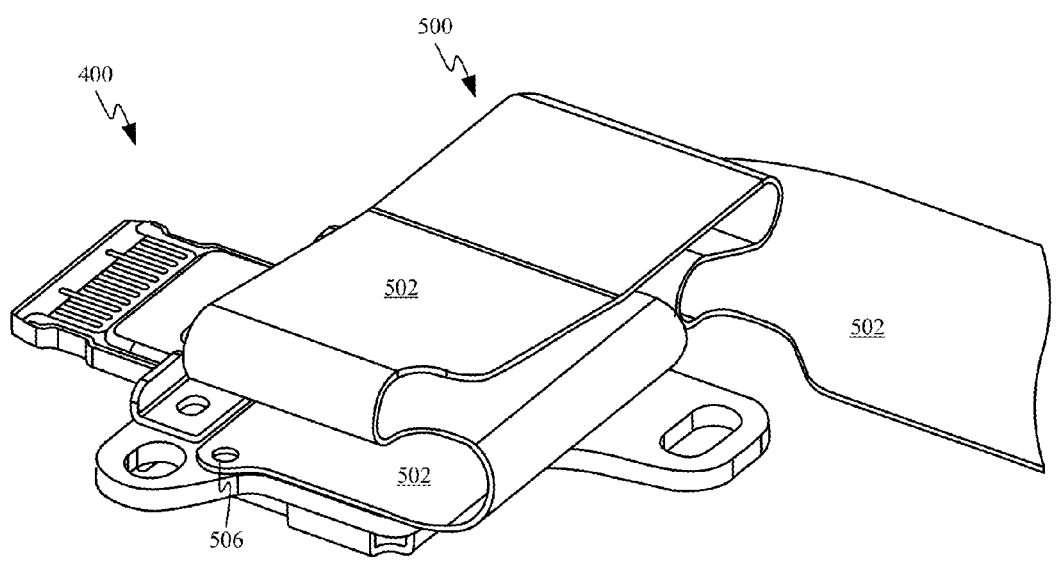
FIG. 6 shows the flexible PCB coupled to the PCB module.

FIG. 6 shows flexible PCB 500 coupled to PCB module 400. Flexible PCB 500 is configured to be arranged with numerous bends, as depicted. The depicted bends can help to provide room to accommodate a longer overall polymeric substrate 502, which allows an installer to maneuver PCB module 400 around more easily during installation of the module within a portable electronic device such as portable electronic device 100. In some embodiments, polymeric substrate can be pre-bent in order to help polymeric substrate 502 to lie down securely in place after installation of PCB module 400. FIG. 6 also shows how alignment openings 506 do not need to include fasteners to secure flexible PCB 500 to PCB module 400 since the solder connecting the electrical contacts of both objects securely joins flexible PCB 500 to PCB module 400.

Figure 7:
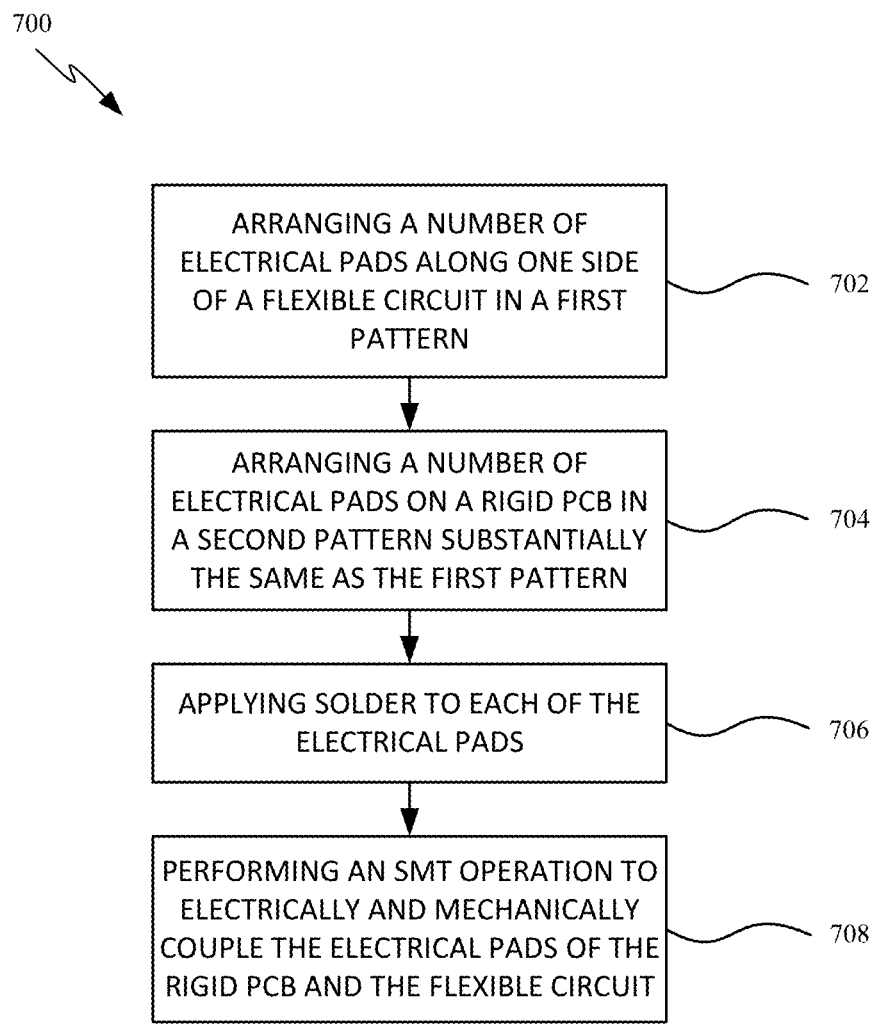
FIG. 7 shows a flow chart, which depicts a method for forming a robust electrical connection between a flexible PCB and a rigid PCB.

FIG. 7 shows a flow chart 700, which depicts a method for creating an electrical connection between a flexible PCB and a rigid PCB. At 702, a number of electrical pads are arranged along one side of the flexible PCB in a first pattern. The electrical pads can be generated by a deposition process in which copper is deposited in the first pattern. Because electrical pads have low manufacturing costs, customizing the electrical pads to have a particular size, shape and arrangement can involve minimal cost expenditures. At 704, a number of similar electrical pads are arranged along a surface of the rigid PCB in a second pattern substantially the same as the first pattern. In some embodiments, the electrical pads can be formed of copper material and coupled with electrically conductive pathways of both the flexible PCB and the rigid PCB. Because the layout of the pads can be adjusted as desired, certain electrical pads can be maneuvered to help in routing signals within both the flexible PCB and the rigid PCB. This flexibility can minimizes signal routing complexity, which can reduce cost and improve signal strength. At 706, solder paste is arranged on the electrical contacts of the flexible PCB and/or the electrical contacts of the rigid PCB. In some embodiments, the solder paste can be applied to the electrical contacts by a stencil printing process. At 708, the flexible PCB and the rigid PCB are aligned and run through an SMT process. The SMT process involves subjecting the flexible PCB and rigid PCB to high temperature convection reflow to form a solder joint between the arrays of electrical pads. The flexible PCB and the rigid PCB can be aligned by a fixturing device that includes one or more alignment pins during the SMT process. The alignment pins can be arranged through openings in both the flexible PCB and the rigid PCB so that precise alignment of corresponding electrical contacts can be achieved. The fixturing device is made up of high temperature materials that also function to hold both the rigid PCB and flexible PCB flat together during the SMT process. After the SMT process is complete the two components are both electrically and mechanically coupled together by a solidified solder joint. After achieving the electrical and mechanical connection of the electrical contacts the alignment pins can be removed.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line in which the described SMT processing takes place. The computer readable medium is any data storage device that can store data which can thereafter be read by a computer system. Examples of the computer readable medium include read-only memory, random-access memory, CD-ROMs, HDDs, DVDs, magnetic tape, and optical data storage devices.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic assembly, comprising:
   a flexible printed circuit board (PCB), comprising a first array of electrical pads arranged at a first end of the flexible PCB, the first array of electrical pads being distributed along three or more sides of a notch defined by the first end of the flexible PCB; and
   a rigid PCB;

an electrical component mounted to a surface of the rigid PCB and extending through the notch; and a second array of electrical pads arranged along the surface of the rigid PCB adjacent to the electrical component, the first array of electrical pads being soldered directly to corresponding ones of the second array of electrical pads.

2. The electronic assembly of claim 1, wherein the first array of electrical pads comprises a first electrical pad and a second electrical pad substantially larger than the second electrical pad.

3. The electronic assembly of claim 1, wherein the rigid PCB comprises an edge connector.

4. The electronic assembly of claim 3, wherein the edge connector of the rigid PCB is a tongue portion of an input/output port.

5. The electronic assembly of claim 1, wherein the rigid PCB is a first rigid PCB and wherein the electronic assembly further comprises a second rigid PCB electrically coupled with a second end of the flexible PCB.

6. The electronic assembly of claim 5, wherein an entirety of the first end extends over the surface of the rigid PCB.

7. An electronic device, comprising:
a device housing comprising a housing wall defining an opening extending through the housing wall, the opening including a data plug receptacle portion;
a first printed circuit board (PCB) disposed within the device housing and comprising a connector;
a second PCB having a first portion protruding into the data plug receptacle portion of the opening, the second PCB comprising a first array of electrical contacts arranged in a first pattern on a second portion of the second PCB disposed within the device housing;
a flexible multi-layer connector disposed within the device housing and electrically coupling the first PCB to the second PCB, the flexible multi-layer connector comprising:
a first end comprising a second array of electrical contacts soldered directly to the first array of electrical contacts; and
a second end opposite the first end and electrically coupled to the connector of the first PCB.

8. The electronic device of claim 7, wherein the flexible multi-layer connector comprises a polyimide substrate.

9. The electronic device of claim 7, wherein the second end of the flexible multi-layer connector is releasably coupled with the connector of the first PCB.

10. The electronic device of claim 7, wherein the first array of electrical contacts comprises a first electrical contact and a second electrical contact substantially larger than the first electrical contact.

11. The electronic device of claim 10, wherein the second electrical contact is configured to transfer high voltage power between the second PCB and the flexible multi-layer connector.

12. The electronic device of claim 11, wherein the second electrical contact has a channel extending therethrough to allow gases generating during an SMT process to dissipate.

* * * * *